United States Patent
Diep et al.

(10) Patent No.: US 10,574,210 B2
(45) Date of Patent: Feb. 25, 2020

(54) BAW DEVICES HAVING TOP ELECTRODE LEADS WITH REDUCED REFLECTANCE

(71) Applicant: Qorvo US, Inc., Greensboro, NC (US)

(72) Inventors: Buu Quoc Diep, Murphy, TX (US); Matthew L. Wasilik, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 498 days.

(21) Appl. No.: 15/475,821

(22) Filed: Mar. 31, 2017

(65) Prior Publication Data

US 2017/0288644 A1    Oct. 5, 2017

Related U.S. Application Data

(60) Provisional application No. 62/315,733, filed on Mar. 31, 2016.

(51) Int. Cl.
*H01L 41/053* (2006.01)
*H01L 41/047* (2006.01)
*H01L 41/09* (2006.01)
*H03H 9/54* (2006.01)
*H03H 3/02* (2006.01)
*H01L 41/107* (2006.01)
*H01L 41/29* (2013.01)

(52) U.S. Cl.
CPC ............ *H03H 9/54* (2013.01); *H01L 41/047* (2013.01); *H01L 41/107* (2013.01); *H01L 41/29* (2013.01); *H03H 3/02* (2013.01)

(58) Field of Classification Search
CPC ...... H03H 9/176; H03H 3/02; H03H 9/02031; H03H 9/171

USPC ................................................. 310/340, 365
See application file for complete search history.

(56) References Cited

U.S. PATENT DOCUMENTS

| 5,710,067 | A  | 1/1998  | Foote et al.   |
| 6,343,171 | B1 | 1/2002  | Yoshimura et al. |
| 7,670,945 | B2 | 3/2010  | Huang          |
| 7,851,346 | B2 | 12/2010 | Lee et al.     |

(Continued)

OTHER PUBLICATIONS

Author Unknown, "Understanding Brewer Science's Bottom Anti-Reflective Coatings," ARC Technology to Build On, DCIF: MKT00XX, Doc. Control#: F.6.6.010X.A, 2002, Rolla MO, USA, Brewer Science Inc., 24 slides.

(Continued)

*Primary Examiner* — Thomas M Dougherty
(74) *Attorney, Agent, or Firm* — Withrow & Terranova, P.L.L.C.

(57) ABSTRACT

The present disclosure relates to a Wafer-level-packaged Bulk Acoustic Wave (BAW) device, which includes a bottom electrode, a top electrode, a top electrode lead, a piezoelectric layer sandwiched between the bottom and the top electrodes, an enclosure, and an anti-reflective layer (ARL). Herein, an active region for a resonator is formed where the bottom electrode and the top electrode overlap. The top electrode lead is over the piezoelectric layer and extending from the top electrode. The enclosure includes a cap and an outer wall that extends from the cap toward the piezoelectric layer to form a cavity. The top electrode resides in the cavity and a first portion of the outer wall resides over the top electrode lead. The ARL, with a reflectance less than 40% R, is between the first portion of the outer wall and the top electrode lead.

26 Claims, 11 Drawing Sheets

(56) References Cited

U.S. PATENT DOCUMENTS

| | | | |
|---|---|---|---|
| 8,159,070 B2 | 4/2012 | Lin et al. | |
| 8,201,311 B1 | 6/2012 | Hamou et al. | |
| 9,048,200 B2 | 6/2015 | Homma et al. | |
| 9,537,465 B1* | 1/2017 | Shealy | H01L 41/39 |
| 2014/0333177 A1* | 11/2014 | Guillou | H01L 41/0533 |
| | | | 310/321 |
| 2017/0214387 A1* | 7/2017 | Burak | H03H 9/173 |
| 2018/0109237 A1* | 4/2018 | Wasilik | H03H 9/105 |

OTHER PUBLICATIONS

Fattinger, G. et al., "Bulk Acoustic Wave Technology Advances," CS MANTECH Conference, May 13-16, 2013, New Orleans, Louisiana, USA, pp. 315-318.

Fattinger, Gernot et al., "Miniaturization of BAW Devices and the Impact of Wafer Level Packaging Technology," Joint UFFC, EFTF and PFM Symposium, 2013, IEEE, pp. 228-231.

Franosch, M. et al., "Wafer-Level-Package for Bulk Acoustic Wave (BAW) Filters," IEEE MTT-S InternationalMicrowave Symposium Digest, Jun. 6-11, 2004, Fort Worth, TX, USA, IEEE, pp. 493-496.

Guo, Xu et al., "A New Strategy of Lithography Based on Phase Separation of Polymer Blends," Scientific Reports, vol. 5, published online Oct. 30, 2015, accessed onlin Apr. 15, 2016, htttps://www.ncbi.nlm.nih.gov/pmc/articles/PMC4626759/, Macmillan Publishers Limited, pp. 1-11.

Mack, Chris A., "Semiconductor Lithography (Photolithography)—The Basic Process," The Basics of Microlithography, accessed Apr. 15, 2016, http://www.lithoguru.com/scientist/lithobasics.html, Chris A. Mack, 11 pages.

Tompkins, Harland G. et al, "An inorganic antireflective coating for use in photolithography," Journal of Applied Physics, vol. 73, Issue 8, Apr. 15, 1993, AIP Publishing, pp. 3932-3938.

* cited by examiner

BAW DEVICES HAVING TOP ELECTRODE LEADS WITH REDUCED REFLECTANCE

RELATED APPLICATIONS

This application claims the benefit of provisional patent application Ser. No. 62/315,733, filed Mar. 31, 2016, the disclosure of which is hereby incorporated herein by reference in its entirety.

FIELD OF THE DISCLOSURE

The present disclosure relates to a Wafer-level-packaged Bulk Acoustic Wave (BAW) device, and more particularly to a BAW device having top electrode leads with reduced reflectance.

BACKGROUND

Due to their small size, high Q values, and very low insertion losses at microwave frequencies, particularly those above 1.5 Gigahertz (GHz), Bulk Acoustic Wave (BAW) filters have become the filter of choice for many modern wireless applications. In particular, BAW filters are the filter of choice for many $3^{rd}$ Generation (3G) and $4^{th}$ Generation (4G) wireless devices, and are destined to dominate filter applications for 5th Generation (5G) wireless devices. For mobile devices, the low insertion loss of the BAW filter provides many advantages such as improved battery life, compensation for higher losses associated with the need to support many frequency bands in a single mobile device, etc.

Figure 1:
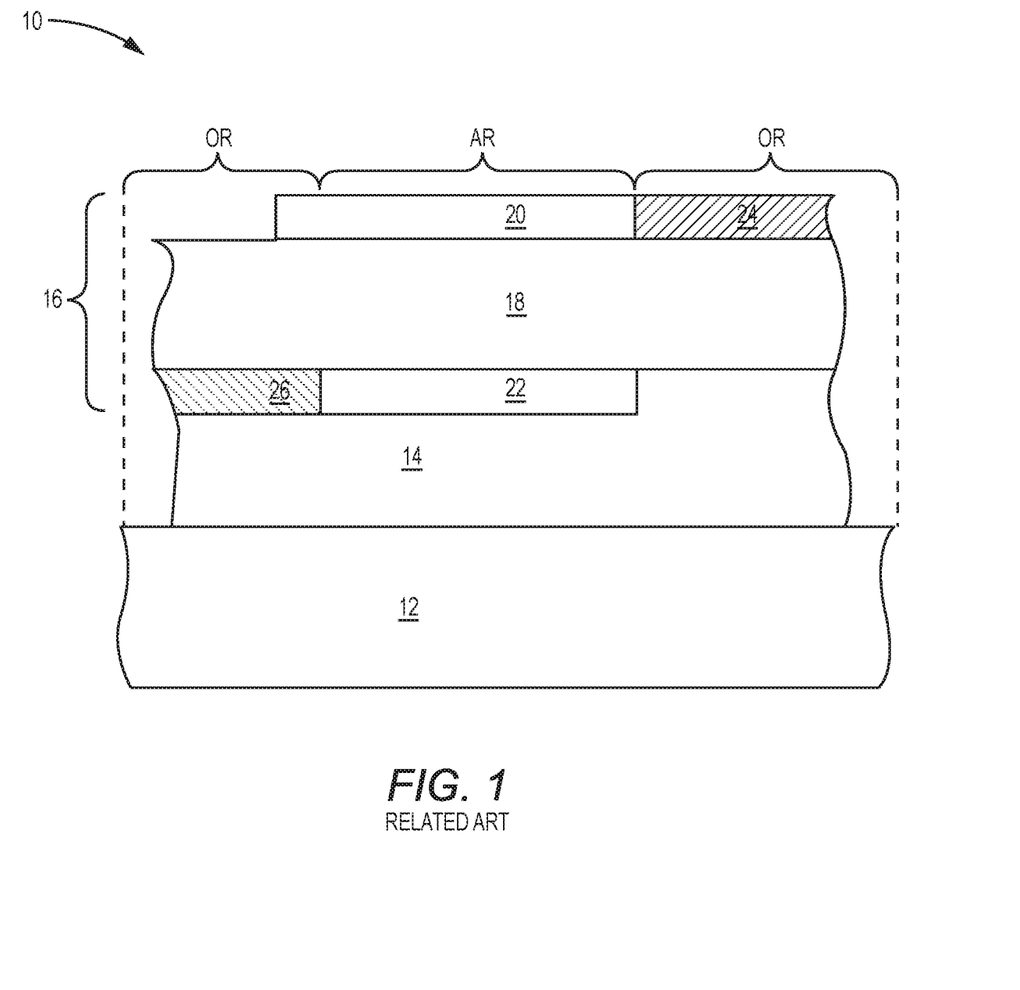
FIG. 1 provides a conventional Bulk Acoustic Wave (BAW) resonator.

One example of a conventional BAW resonator 10 is illustrated in FIG. 1. In this example, the BAW resonator 10 is, in particular, a Solidly Mounted Resonator (SMR) type BAW resonator 10. As illustrated, the BAW resonator 10 includes a substrate 12, a reflector 14 over the substrate 12, and a transducer 16 over the reflector 14. The reflector 14 is typically formed by a stack of reflector layers (not shown), which alternate in material composition to produce a significant reflection coefficient at the junction of adjacent reflector layers. The transducer 16 includes a piezoelectric layer 18, which is sandwiched between a top electrode 20 and a bottom electrode 22. The transducer 16 may also include a top electrode lead 24 and a bottom electrode lead 26. The top electrode lead 24 resides on the piezoelectric layer 18 and is connected to the top electrode 20. The bottom electrode lead 26 resides underneath the piezoelectric layer 18 and is connected to the bottom electrode 22.

The BAW resonator 10 is divided into an active region AR and an outside region OR. The active region AR is electrically driven and generally corresponds to the section of the BAW resonator 10 where the top and bottom electrodes 20 and 22 overlap and also includes the layers below the overlapping top and bottom electrodes 20 and 22. The outside region OR is not electrically driven and corresponds to the section of the BAW resonator 10 that surrounds the active region AR.

In operation, acoustic waves in the piezoelectric layer 18 within the active region AR of the BAW resonator 10 are excited by an electrical signal applied to the bottom and top electrodes 20 and 22. The frequency at which resonance of the acoustic waves occurs is a function of the thickness of the piezoelectric layer 18 and the mass of the bottom and top electrodes 20 and 22. At high frequencies (e.g., greater than 1.5 GHz), the thickness of the piezoelectric layer 18 may be only micrometers thick and, as such, the BAW resonator 10 is fabricated using thin-film techniques.

In order to protect BAW resonators or BAW devices from external elements (such as moisture, contamination, etc.), housings, also known as Wafer-level packaging (WLP) walls and caps, are applied to enclose the BAW resonators or BAW devices. However, during the lithography process, cross-linking, also known as "scumming," of the WLP walls may be present in regions where top electrode leads, with a high reflectance top layer, are routed under the WLP walls. These top electrode leads cause reflection or scattering of light to the WLP walls over them, which results in scumming of the WLP walls.

Figure 2:
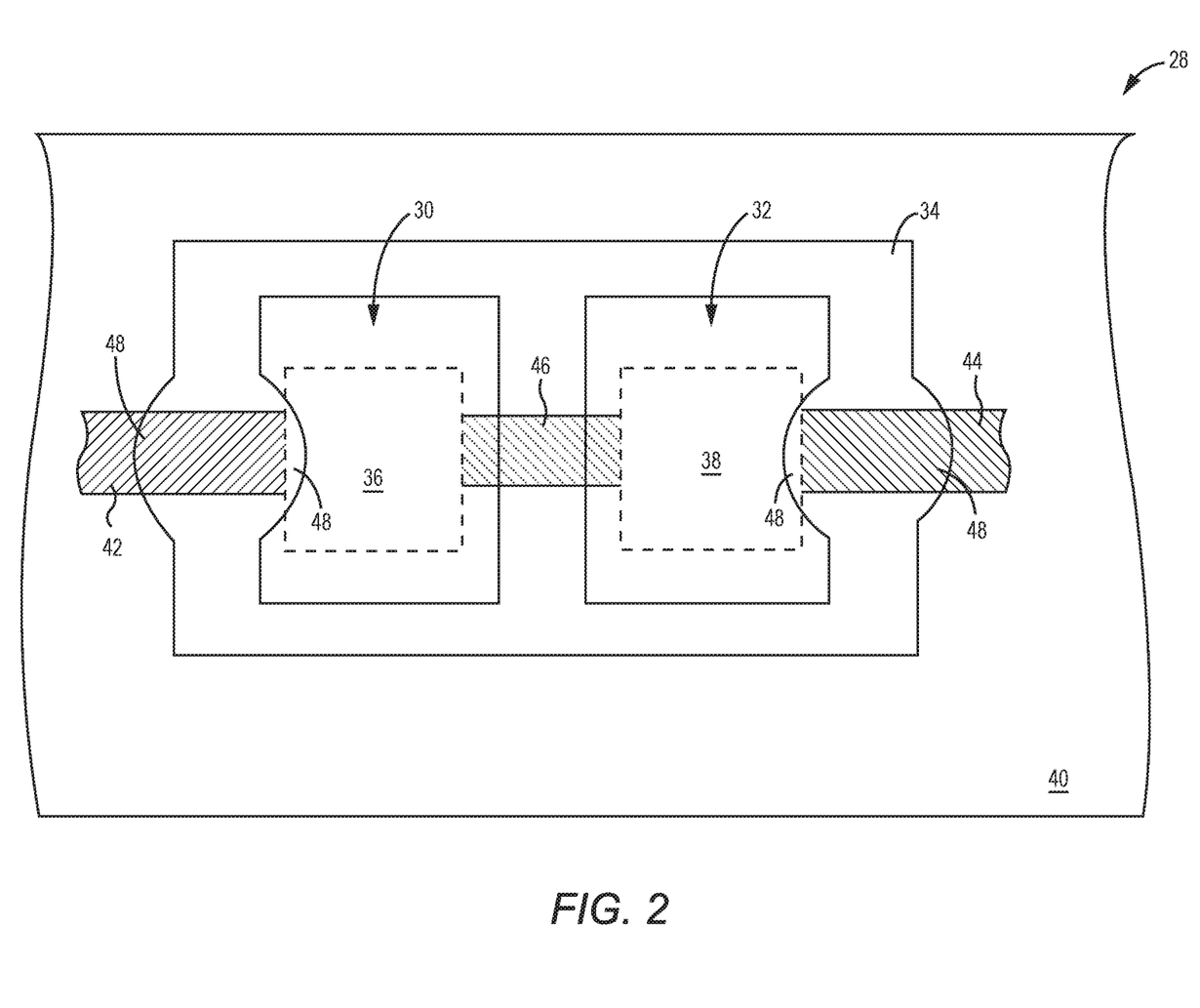
FIG. 2 provides an exemplary BAW device with scumming effects.

FIG. 2 shows a top view of a BAW device 28 with scumming effects. As illustrated, the BAW device 28 includes a first BAW resonator 30, a second BAW resonator 32, and a WLP enclosure 34. A first top electrode 36 of the first BAW resonator 30 and a second top electrode 38 of the second BAW resonator 32 are formed on a piezoelectric layer 40 of the BAW device 28. The WLP enclosure 34 is coupled to the piezoelectric layer 40 to encapsulate the first top electrode 36 and the second top electrode 38 separately. In addition, a first top electrode lead 42 extends from the first top electrode 36 and is routed under a first portion of an outer wall of the WLP enclosure 34. A second top electrode lead 44 extends from the second top electrode 38 and is routed under a second portion of the outer wall of the WLP enclosure 34. Herein, bottom electrodes (now shown) of the first BAW resonator 30 and the second BAW resonator 32 may be connected by a bottom electrode lead 46, which is underneath the piezoelectric layer 40 and routed under an inner wall of the WLP enclosure 34.

Notice that the bottom electrode lead 46 is separate from the inner wall of the WLP enclosure 34 by the piezoelectric layer 40. Even with a high reflectance top layer, the bottom electrode lead 46 will not cause scumming of the inner wall of the WLP enclosure 34. However, since the first/second top electrode lead 42/44 is adjacent under the outer wall of the WLP enclosure 34, when the first/second top electrode lead 42/44 includes a high reflectance top layer, scumming 48 is present in the first/second portion of the outer wall of the WLP enclosure 34. The scumming 48 may extend over the first top electrode 36 and the second top electrode 38, which will cause significant yield loss of the first and second BAW resonators 30 and 32.

Accordingly, there remains a need for improved BAW device designs to inhibit scumming of the WLP walls. Further, there is also a need to keep the final product size effective and cost effective.

SUMMARY

The present disclosure relates to a Wafer-level-packaged Bulk Acoustic Wave (BAW) device that has top electrode leads with reduced reflectance. The BAW device includes a piezoelectric layer, a bottom electrode, a top electrode, a top electrode lead, an enclosure, and an anti-reflective layer (ARL). The bottom electrode is on a bottom surface of the piezoelectric layer. The top electrode is on a top surface of the piezoelectric layer, which is opposite the bottom surface of the piezoelectric layer. Herein, an active region for a resonator is formed where the bottom electrode and the top electrode overlap. The top electrode lead is on the top surface of the piezoelectric layer and extends from the top electrode. The enclosure includes a cap and an outer wall that extends from the cap toward the top surface of the piezoelectric layer to form a cavity. The top electrode resides in the cavity and a first portion of the outer wall resides over a first portion of a top surface of the top electrode lead. The ARL is between the first portion of the outer wall and the first portion of the top surface of the top electrode lead. The ARL has a reflectance less than 40% R.

In one embodiment of the BAW device, the ARL has a reflectance less than 30% R.

In one embodiment of the BAW device, the ARL has a reflectance less than 20% R.

In one embodiment of the BAW device, the ARL has a reflectance less than 10% R.

In one embodiment of the BAW device, the ARL covers the top surface of the top electrode lead at all portions that are aligned below the outer wall.

In one embodiment of the BAW device, the top surface of the top electrode lead is fully covered by the ARL.

In one embodiment of the BAW device, the ARL does not cover the top electrode.

In one embodiment of the BAW device, the ARL extends over a portion of the top electrode.

In one embodiment of the BAW device, the ARL is formed of Tungsten (W), Titanium Tungsten (TiW), Titanium Nitride (TiN), or Molybdenum (Mo), and has a thickness between 50 Å and 5000 Å.

In one embodiment of the BAW device, the top electrode lead includes an electrode layer at the top of the top electrode lead, wherein the ARL is less reflective than the electrode layer of the top electrode lead.

In one embodiment of the BAW device, the top electrode and the top electrode lead share at least a common portion of a first electrode layer and a common portion of a second electrode layer. The first electrode layer is over the top surface of the piezoelectric layer, the second electrode layer is over the first electrode layer, and the ARL is over the second electrode layer. Herein, the ARL is less reflective than the second electrode layer.

In one embodiment of the BAW device, the top electrode lead further includes a third electrode layer and a fourth electrode layer. The third electrode layer is over the second electrode layer, the fourth electrode layer is over the third electrode layer, and the ARL is over the fourth electrode layer. Herein, the ARL is less reflective than the fourth electrode layer. In addition, the top electrode does not include the third electrode layer or the fourth electrode layer.

In one embodiment of the BAW device, the top electrode further includes a border ring that is between the first electrode layer and the second electrode layer, and around a periphery of the active region.

According to another embodiment, the BAW device further includes a passivation layer that is directly over a portion of the top surface of the piezoelectric layer, exposed surfaces of the top electrode, exposed surfaces of the top electrode lead, and the ARL. Herein, the portion of the top surface of the piezoelectric layer is exposed through the top electrode and the top electrode lead. The outer wall of the enclosure is directly coupled to the passivation layer.

In one embodiment of the BAW device, the passivation layer is formed of Silicon Nitride (SiN), Silicon Oxide (SiO$_2$), or Silicon Oxynitride (SiON), and has a thickness between 250 Å and 5000 Å.

According to another embodiment, the BAW device further includes a second top electrode that is on the top surface of the piezoelectric layer, separate from the top electrode and the top electrode lead, and exposed to the cavity.

According to an exemplary process for making a BAW device, a bottom electrode is first provided. Then, a piezoelectric layer is formed over the bottom electrode. The bottom electrode is coupled to a bottom surface of the piezoelectric layer. A top electrode and a top electrode lead are formed on a top surface of the piezoelectric layer, which is opposite the bottom surface of the piezoelectric layer. Herein, an active region for a resonator is formed where the bottom electrode and the top electrode overlap. The top electrode lead extends from the top electrode. Next, an ARL is applied over a first portion of a top surface of the top electrode lead. The ARL has a reflectance less than 40% R. Finally, an enclosure that includes a cap and an outer wall is formed over the top surface of the piezoelectric layer. The outer wall extends from the cap toward the top surface of the piezoelectric layer to form a cavity, in which the top electrode resides. A first portion of the outer wall resides over the ARL that is over the first portion of the top surface of the top electrode lead.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-5F may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3A:
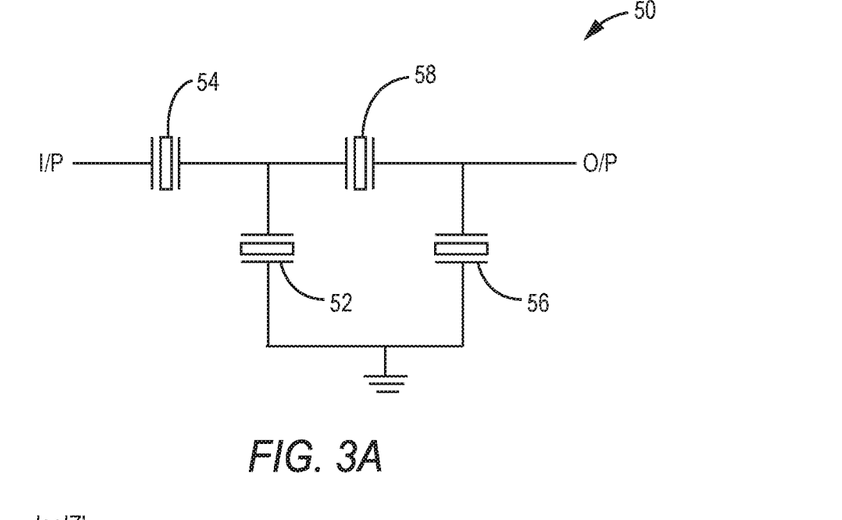
FIGS. 3A-3C provide an exemplary circuitry and frequency responses for a BAW filter.

Bulk Acoustic Wave (BAW) resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW filters also have relatively low insertion loss, tend to decrease in size as the frequency of operation increases, and are relatively stable over wide temperature ranges. FIG. 3A shows a BAW filter 50 with a ladder configuration. The BAW filter 50 includes a first shunt resonator 52, a first series resonator 54, a second shunt resonator 56, and a second series resonator 58. The first series resonator 54 and the second series resonator 58 are coupled in series and coupled between an input port VP and an output port O/P. The first shunt resonator 52 is coupled between the first series resonator 54 and ground, and the second shunt resonator 56 is coupled between the second series resonator 58 and ground.

Figure 3B:
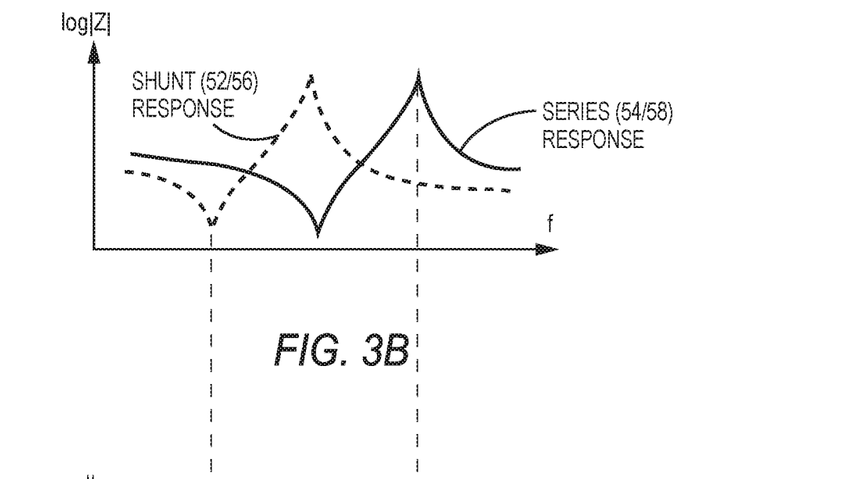
Figure 3C:
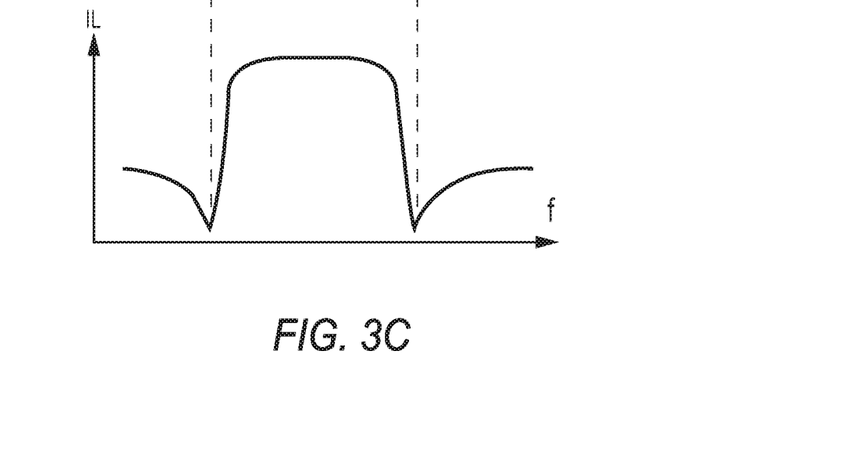

As shown in FIG. 3B, the first and second shunt resonators 52 and 56 may have the same shunt response. The first and second series resonators 54 and 58 may have the same series response, which is different than the shunt response. In many applications, the first/second shunt resonator 52/56 may be a detuned version of the first/second series resonator 54/58. As such, the shunt response for the first/second shunt resonator 52/56 is similar to the series response for the first/second series resonator 54/58, yet frequency shifted relative to the series response. FIG. 3C is associated with FIG. 3B and illustrates the frequency response of the BAW filter 50.

Figure 4A:
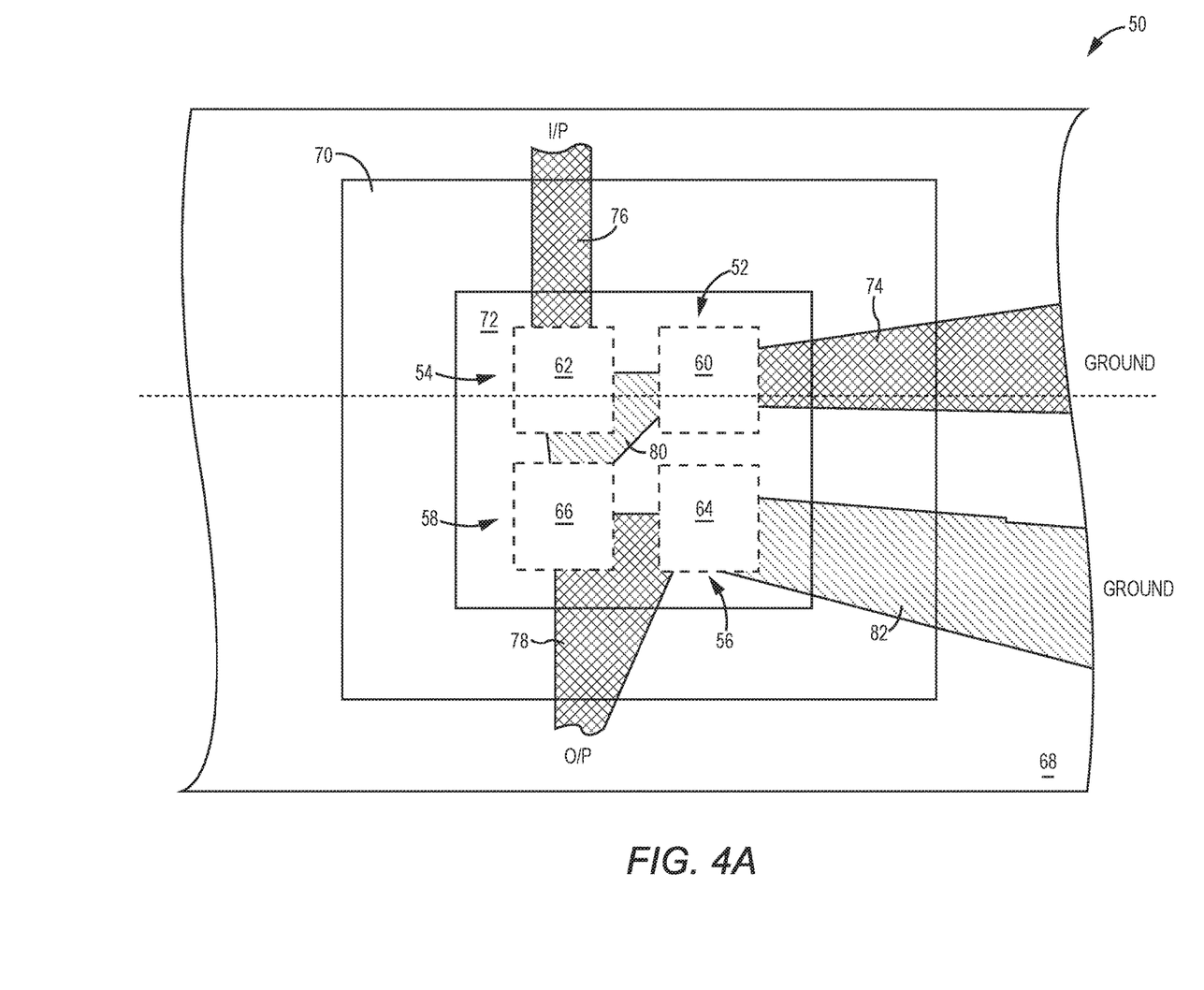
FIGS. 4A-4C provide exemplary layout diagrams to implement the BAW filter shown in FIG. 3A according to one embodiment of the present disclosure.

FIG. 4A shows an exemplary layout diagram to implement the BAW filter 50 shown in FIG. 3A. The layout diagram illustrates that the first shunt resonator 52, the first series resonator 54, the second shunt resonator 56, and the second shunt resonator 58 are formed in a 2 by 2 configuration. In different applications, the layout of the BAW filter 50 may be formed in different configurations. A first top electrode 60 of the first shunt resonator 52, a second top electrode 62 of the first series resonator 54, a third top electrode 64 of the second shunt resonator 56, and a fourth top electrode 66 of the second series resonator 58 are formed on a top surface of a piezoelectric layer 68 of the BAW filter 50. In this embodiment, the BAW filter 50 further includes an enclosure 70 to encapsulate the first, second, third, and fourth top electrodes 60, 62, 64, and 66. Herein, the first, second, third, and fourth top electrodes 60, 62, 64, and 66 reside in one enclosed cavity 72 formed between the top surface of the piezoelectric layer 68 and the enclosure 70. In some cases, the enclosure 70 may further include inner walls (not shown) to separately encapsulate the first, second, third, and fourth top electrodes 60, 62, 64, and 66.

In addition, the BAW filter 50 includes a first top electrode lead 74, a second top electrode lead 76, a third top electrode lead 78, a first bottom electrode lead 80, and a second bottom electrode lead 82. The first, second, and third top electrode leads 74, 76, and 78 are formed on the top surface of the piezoelectric layer 68; while the first and second bottom electrode leads 80 and 82 are formed on a bottom surface of the piezoelectric layer 68, which is opposite the top surface of the piezoelectric layer 68. The first top electrode lead 74 extends from the first top electrode 60 toward ground, the second top electrode lead 76 extends from the second top electrode 62 toward the input port VP, and the third top electrode lead 78 connects the third top electrode 64 and the fourth top electrode 66 and extends from the fourth top electrode 66 toward the output port O/P. The first bottom electrode lead 80 is used to connect bottom electrodes (now shown) of the first shunt resonator 52, the first series resonator 54, and the second series resonator 58. The second bottom electrode lead 82 is used to connect a bottom electrode (not shown) of the second shunt resonator 56 to ground.

Figure 4B:
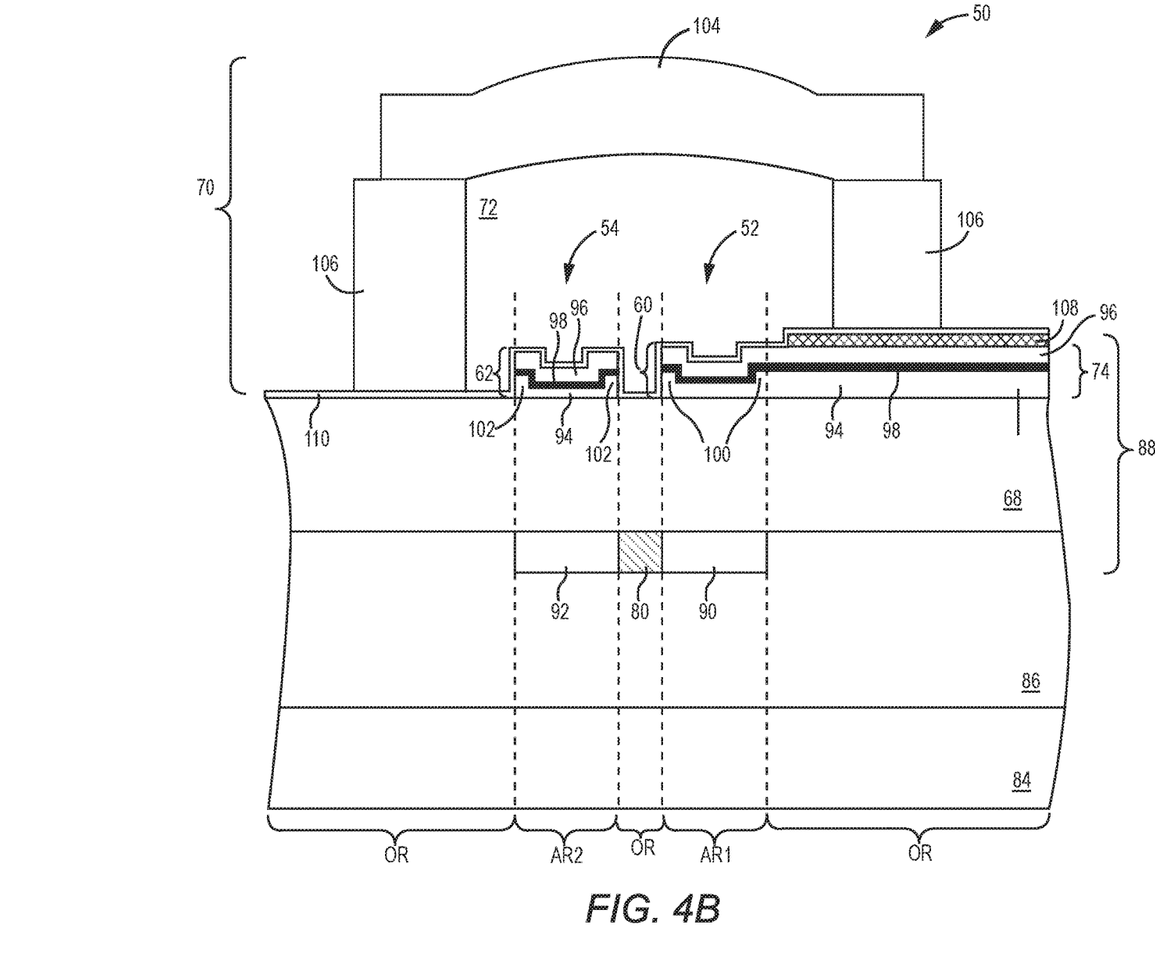

FIG. 4B shows a cross-sectional view of the exemplary BAW filter 50 at the dotted-line in FIG. 4A. The BAW filter 50 includes a substrate 84, a reflector region 86 over the substrate 84, a transducer region 88 over the reflector region 86, and the enclosure 70. The substrate 84 may be formed of Silicon (Si). The reflector region 86 includes multiple alternating layers (not shown) of alternating materials with varying refractive index. In this embodiment, these multiple alternating layers may be formed of Silicon Dioxide ($SiO_2$) and Tungsten (W).

The transducer region 88 includes a first bottom electrode 90, a second bottom electrode 92, the first bottom electrode lead 80, the piezoelectric layer 68, the first top electrode 60, the second top electrode 62, and the first top electrode lead 74. The first bottom electrode 90, the second bottom electrode 92, and the first bottom electrode lead 80 are on the bottom surface of the piezoelectric layer 68. The first top electrode 60, the second top electrode 62, and the first top electrode lead 74 are on the top surface of the piezoelectric layer 68. Herein, the top surface of the piezoelectric layer 68 is opposite the bottom surface of the piezoelectric layer 68. A first active region AR1 for the first shunt resonator 52 is formed where the first bottom electrode 90 and the first top electrode 60 overlap, and also includes the layers below the overlapping first top and first bottom electrodes 60 and 90. A second active region AR2 for the first series resonator 54 is formed where the second bottom electrode 92 and the second top electrode 62 overlap, and also includes the layers below the overlapping second top and second bottom electrodes 62 and 92. Other sections of the BAW filter 50 that surround the first and second active regions AR1 and AR2 are outside regions OR. The first top electrode lead 74 and the first bottom electrode lead 80 reside within the outside regions OR.

The first top electrode 60, the second top electrode 62, and the first top electrode lead 74 are formed from a first electrode layer 94 and a second electrode layer 96, which may have a reflectance larger than 40% R. In some applications, the reflectance of the second electrode layer 96 may reach as high as 95% R. Herein, the first electrode layer 94 is over the top surface of the piezoelectric layer 68 and the second electrode layer 96 is over the first electrode layer 94. In some applications, the first electrode layer 94 may have different thicknesses in the first active region AR1 and the second active region AR2 to create different frequency responses for the first shunt resonator 52 and the first series resonator 54.

In order to improve the interface region between the first electrode layer 94 and the second electrode layer 96, a seed layer 98 may be formed in between. In addition, the first top electrode 62 may further include a first border ring 100 that is between the first electrode layer 94 and the second electrode layer 96, and around a periphery of the first active region AR1 of the first shunt resonator 52. The second top electrode 62 may further include a second border ring 102 that is between the first electrode layer 94 and the second electrode layer 96, and around a periphery of the second active region AR2 of the first series resonator 54. Herein, the first electrode layer 94 may be formed of W, Molybdenum (Mo), or other electrically conductive materials with high acoustic impedance property; the first and second border rings 100 and 102 may be formed of W, Mo, or other electrically conductive materials with high acoustic impedance property; the seed layer 98 may be formed of Titanium Tungsten (TiW); and the second electrode layer 96 may be formed of Aluminum Copper (AlCu) or other highly electrically conductive materials.

In this embodiment, the second top electrode 62 is separate from the first top electrode 60 and the first top electrode lead 74, and the first top electrode lead 74 extends from the first top electrode 60. The first top electrode lead 74 and the first top electrode 60 may share at least a common portion of the first electrode layer 94, a common portion of the second electrode layer 96, and a common portion of the seed layer 98. The first bottom electrode 90 and the second bottom electrode 92 are connected by the first bottom electrode lead 80. The first bottom electrode 90, the second bottom electrode 92, and the first bottom electrode lead 80 may share common multiple layers (not shown).

The enclosure 70 includes a cap 104 and an outer wall 106 that extends from the cap 104 toward the top surface of the piezoelectric layer 68 to form the enclosed cavity 72. In different applications, the cap 104 may cover a portion of a top surface of the outer wall 106, may fully cover the top surface of the outer wall 106 (not shown), or may even extend laterally beyond the outer wall 106 (not shown). The first top electrode 60 and the second top electrode 62 reside in the cavity 72. A first portion of the outer wall 106 resides over a first portion of a top surface of the first top electrode lead 74. A second portion of the outer wall 106 resides over the top surface of the piezoelectric layer 68 and not over the first top electrode lead 74. Herein, the enclosure 70 may be formed of TMMF, SU-8, or photo-definable epoxies.

Notice that the second electrode layer 96, which has a high reflectance larger than 40% R, is at the top of the first top electrode lead 74 and close to the first portion of the outer wall 106. In order to inhibit scumming of the first portion of the outer wall 106, the BAW filter 50 further includes an anti-reflective layer (ARL) 108 between the first portion of the outer wall 106 and the first portion of the top surface of the first top electrode lead 74 (between the first portion of the outer wall 106 and the second electrode layer 96). The ARL 108 is less reflective than the second electrode layer 96 and used to reduce the reflectance of the first top electrode lead 74. The ARL 108 has a reflectance less than 40% R, less than 30% R, less than 20% R, or less than 10% R. The ARL 108 may be formed of W, TiW, Titanium Nitride (TiN), or Mo, with a thickness between 50 Å and 5000 Å or between 100 Å and 500 Å. The ARL 108 may cover the top surface of the first top electrode lead 74 at all portions that are aligned below the outer wall 106, or the ARL 108 may fully cover the top surface of the first top electrode lead 74. In this embodiment, the ARL 108 does not cover the first top electrode 60 or the second top electrode 62. In some applications, the ARL 108 may extend over a portion of the first top electrode 60. In addition, the ARL 108 may also be formed between the outer wall 106 and the second top electrode lead 76, and between the outer wall 106 and the third top electrode lead 78. Further, if the enclosure 70 includes inner walls (not shown) that extend from the cap 104 toward the top surface of the piezoelectric layer 68 and reside over any top electrode lead (74, 76 or 78), the ARL 108 may also be formed between the inner walls and the corresponding top electrode.

Lastly, the BAW filter 50 may include a passivation layer 110 over both the active regions AR1 and AR2 and outside regions OR of the BAW filter 50. The passivation layer 110 is directly over a portion of the top surface of the piezoelectric layer 68, where the portion of the top surface of the piezoelectric layer 68 is exposed through the first top electrode 60, the second top electrode 62, and the first top electrode lead 74. The passivation layer 110 is also directly over exposed surfaces of the first top electrode 60, exposed surfaces of the second top electrode 62, exposed surfaces of the first top electrode lead 74, and the ARL 108. As such, the first portion of the outer wall 106 is coupled to the ARL via the passivation layer 110 and the second portion of the outer wall 106 is coupled to the top surface of the piezoelectric layer 68 via the passivation layer 110. Notice that, when the passivation layer 110 is in contact with the ARL 108, it is possible to further reduce the reflectance of the first top electrode lead 74 by controlling the thickness of the passivation layer 110. Consequently, the scumming of the first portion of the outer wall 106 is minimized or even eliminated. In some applications, there may be no passivation layer 110. As such, the first portion of the outer wall 106 is coupled directly to the ARL 108 and the second portion of the outer wall 106 is coupled directly to the top surface of the piezoelectric layer 68. The passivation layer 110 may be formed of Silicon Nitride (SiN), SiO$_2$, or Silicon Oxynitride (SiON), with a thickness between 250 Å and 5000 Å or between 500 Å and 1500 Å.

Figure 4C:
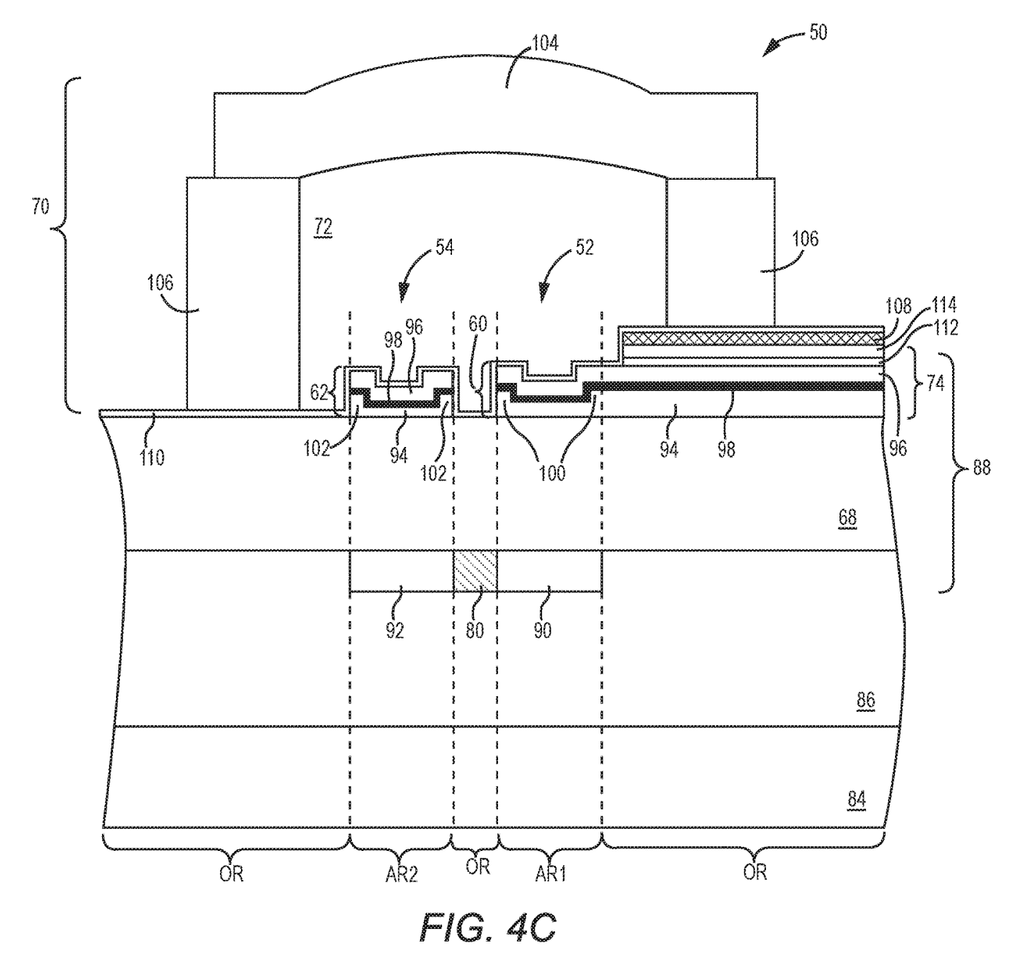

In another embodiment, the first top electrode lead 74 may further include a third electrode layer 112 and a fourth electrode layer 114 as illustrated in FIG. 4C. The third electrode layer 112 is over the second electrode layer 96, the fourth electrode layer 114 is over the third electrode layer 112, and the ARL 108 is between the fourth electrode layer 114 and the first portion of the outer wall 106. Herein, the third electrode layer 112 may be formed of W or other electrically conductive materials that may be used as a barrier for etchant materials. The fourth electrode layer 114 is more reflective than the ARL 108, and may be formed of AlCu or other highly electrical conductive materials. Notice that the first top electrode 60 and the second top electrode 62 do not include the third electrode layer 112 or the fourth electrode layer 114.

FIGS. 5A through 5F provide exemplary fabrication steps that illustrate a process to form the BAW filter 50 shown in FIG. 4C. Although the exemplary fabrication steps in FIGS. 5A-5F are illustrated in a sequential order, the exemplary fabrication steps are not necessarily order dependent. Some fabrication steps may be done in a different order than that presented. Further, fewer or more fabrication steps may be done than those illustrated in FIGS. 5A-5F.

Figure 5A:
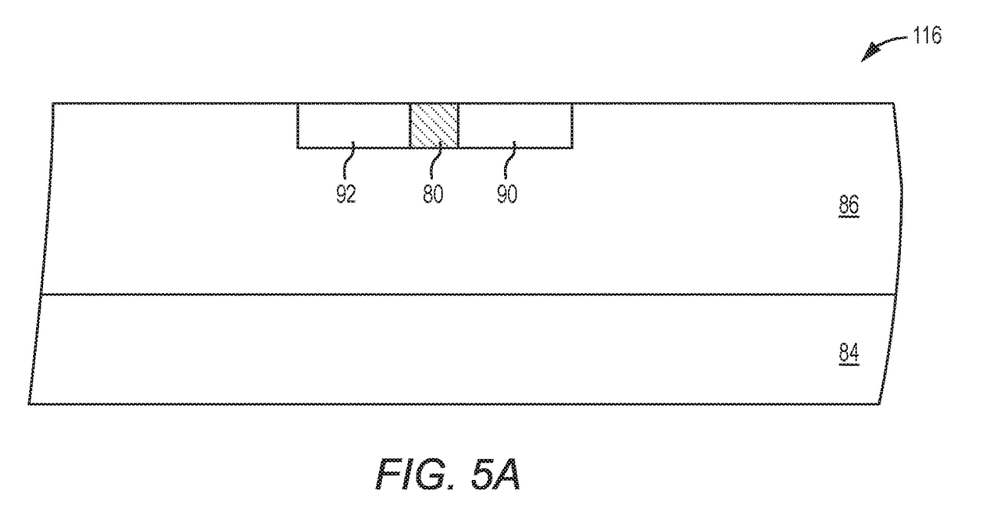
FIGS. 5A-5F illustrate an exemplary process to form the BAW filter shown in FIG. 4C according to one embodiment of the present disclosure.
Figure 5B:
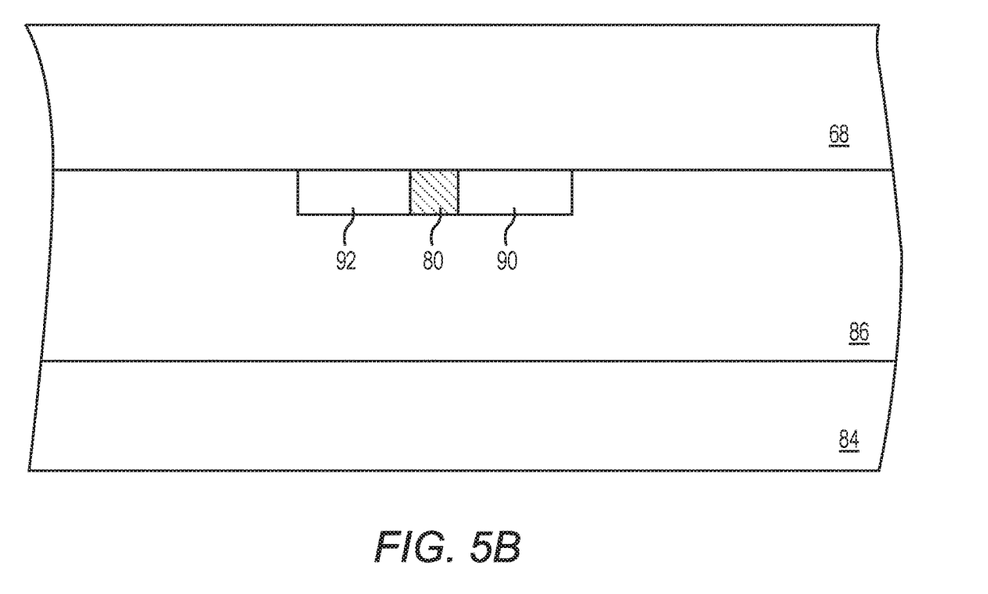

As illustrated in FIG. 5A, the process begins with an initial structure 116 that includes the substrate 84, the reflector region 86, the first bottom electrode 90, the second bottom electrode 92, and the first bottom electrode lead 80. The first bottom electrode 90 and the second bottom electrode 92 are connected by the first bottom electrode lead 80, and reside over the reflector region 86. The initial structure 116 may be fabricated using any appropriate process. Next, the piezoelectric layer 68 is formed over the reflector region 86 as shown in FIG. 5B. The first bottom electrode 90, the second bottom electrode 92, and the first bottom electrode lead 80 are coupled to the bottom surface of the piezoelectric layer 68.

Figure 5C:
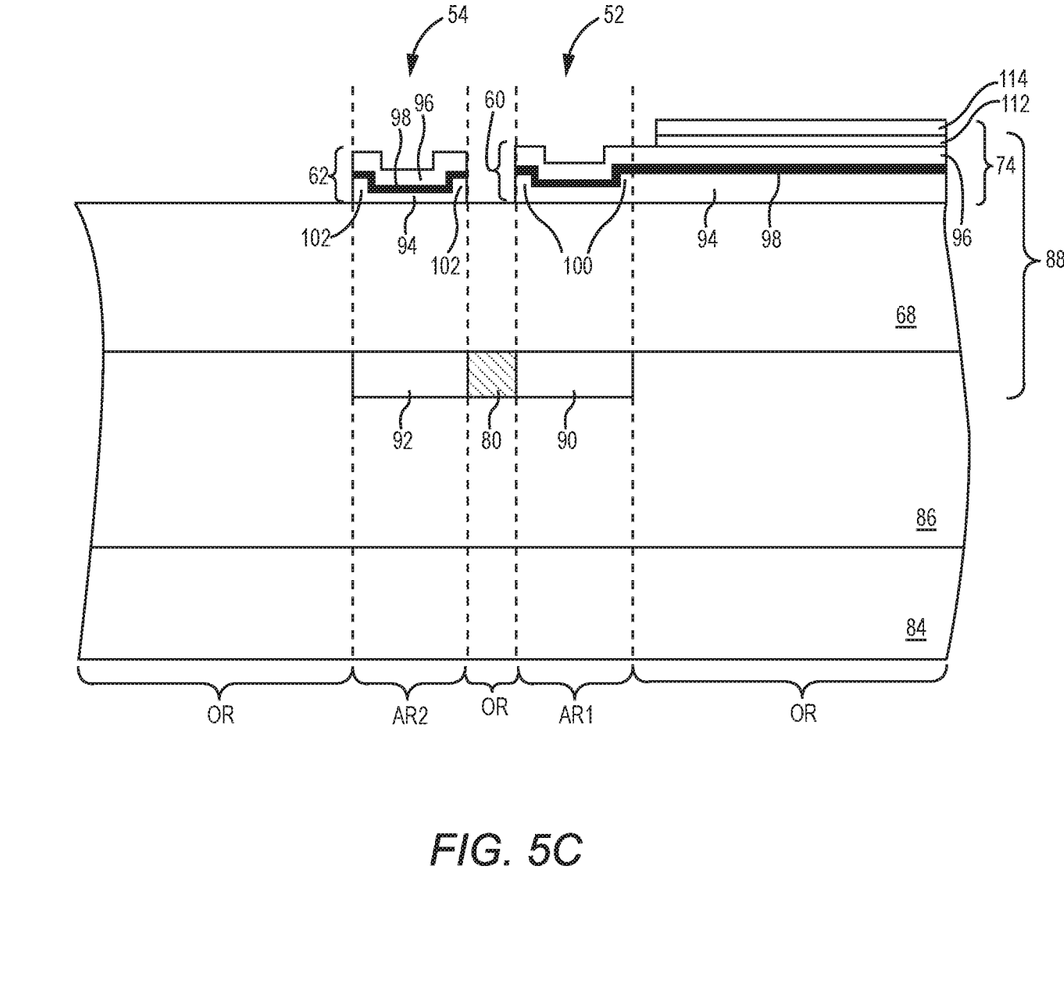

FIG. 5C illustrates forming the first top electrode 60, the second top electrode 62, and the first top electrode lead 74 over the top surface of the piezoelectric layer 68. The first top electrode 60 is aligned above the first bottom electrode 90 and the second top electrode 62 is aligned above the second bottom electrode 92. The first active region AR1 for the first shunt resonator 52 is formed where the first bottom electrode 90 and the first top electrode 60 overlap, and also includes the layers below the overlapping first top and first bottom electrodes 60 and 90. The second active region AR2 for the first series resonator 54 is formed where the second bottom electrode 92 and the second top electrode 62 overlap, and also includes the layers below the overlapping second top and second bottom electrodes 62 and 92. The outside regions OR surround the first and second active regions AR1 and AR2. The first top electrode lead 74 and the first bottom electrode lead 80 reside within the outside regions OR. The second top electrode 62 is separate from the first top electrode 60 and the first top electrode lead 74, and the first top electrode lead 74 extends from the first top electrode 60.

The first top electrode 60, the second top electrode 62, and the first top electrode lead 74 are formed from the first electrode layer 94, the second electrode layer 96, and the seed layer 98. In addition, the first top electrode 60 may further include the first border ring 100 that is between the first electrode layer 94 and the second electrode layer 96, and around a periphery of the first active region AR1 of the first shunt resonator 52. The second top electrode 62 may further include the second border ring 102 that is between the first electrode layer 94 and the second electrode layer 96, and around a periphery of the second active region AR2 of the first series resonator 54.

In this embodiment, the first top electrode lead 74 and the first top electrode 60 may share at least a common portion of the first electrode layer 94, a common portion of the second electrode layer 96, and a common portion of the seed layer 98. The first top electrode lead 74 may further include the third electrode layer 112 and the fourth electrode layer 114, where the third electrode layer 112 and the fourth electrode layer 114 do not extend over the first top electrode 60 or the second top electrode 62.

Figure 5D:
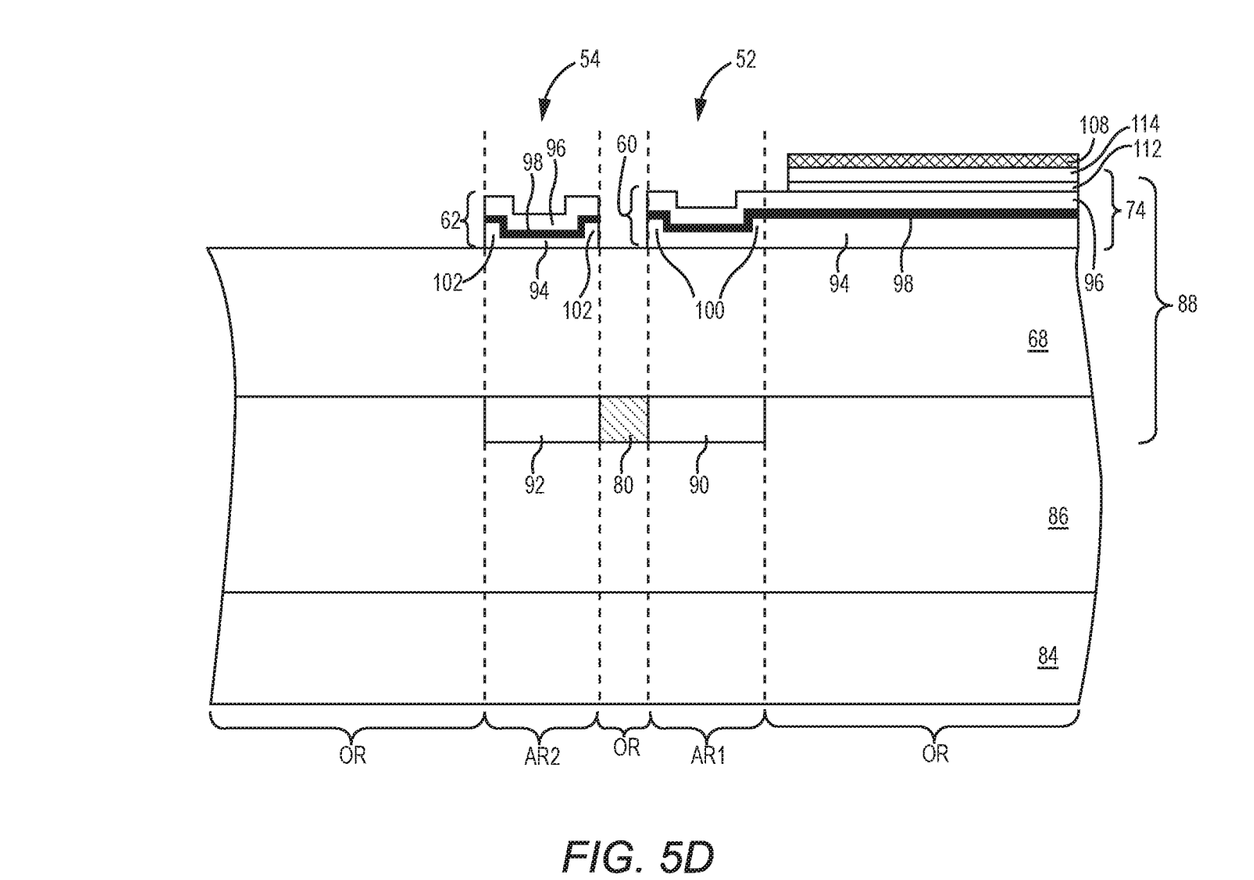
Figure 5E:
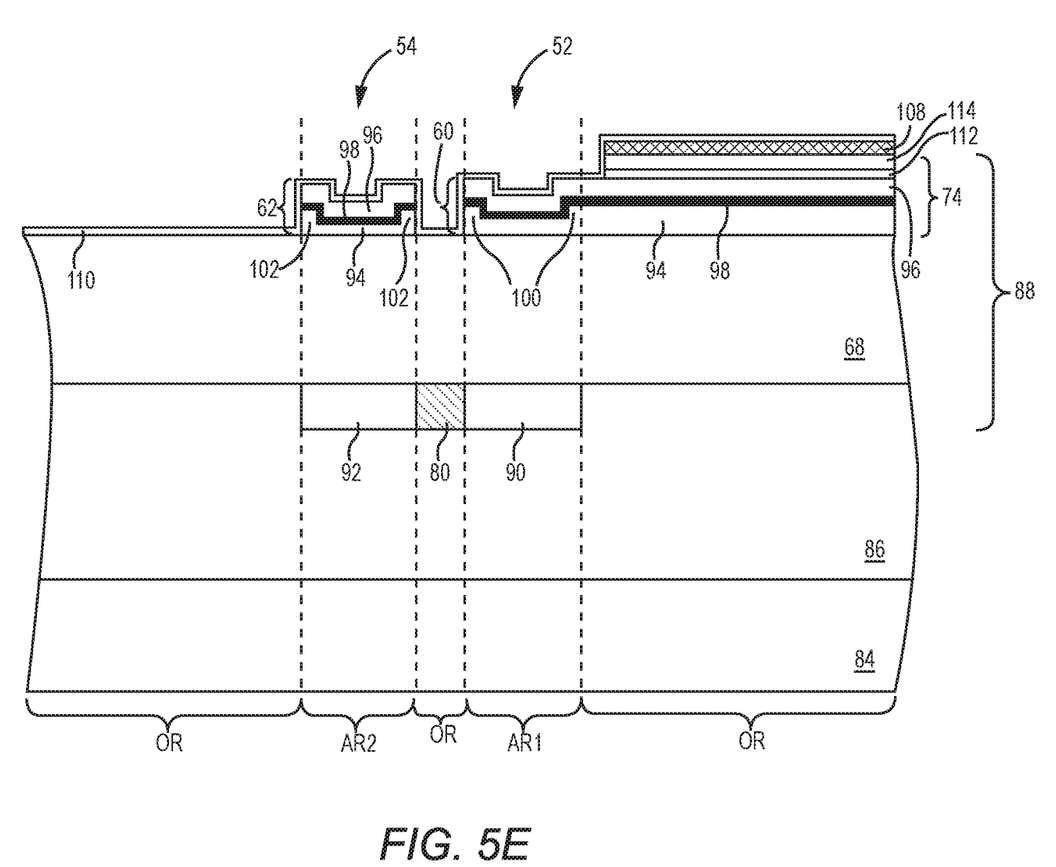

After the first top electrode 60, the second top electrode 62, and the first top electrode lead 74 are formed, the ARL 108 is applied over the fourth electrode layer 114 as shown in FIG. 5D. The ARL 108 covers at least a first portion of a top surface of the first top electrode lead 74. In some applications, the ARL 108 may fully cover the top surface of the first top electrode lead 74 and may extend over a portion of the first top electrode 60 (not shown), which is within the first active region AR1. Then, the passivation layer 110 is formed over both the active regions AR1 and AR2 and outside regions OR as shown in FIG. 5E. The passivation layer 110 is directly over a portion of the top surface of the piezoelectric layer 68, where the portion of the top surface of the piezoelectric layer 68 is exposed through the first top electrode 60, the second top electrode 62, and the first top electrode lead 74. The passivation layer 110 is also directly over the exposed surfaces of the first top electrode 60, the exposed surfaces of the second top electrode 62, the exposed surfaces of the first top electrode lead 74, and the ARL 108.

Figure 5F:
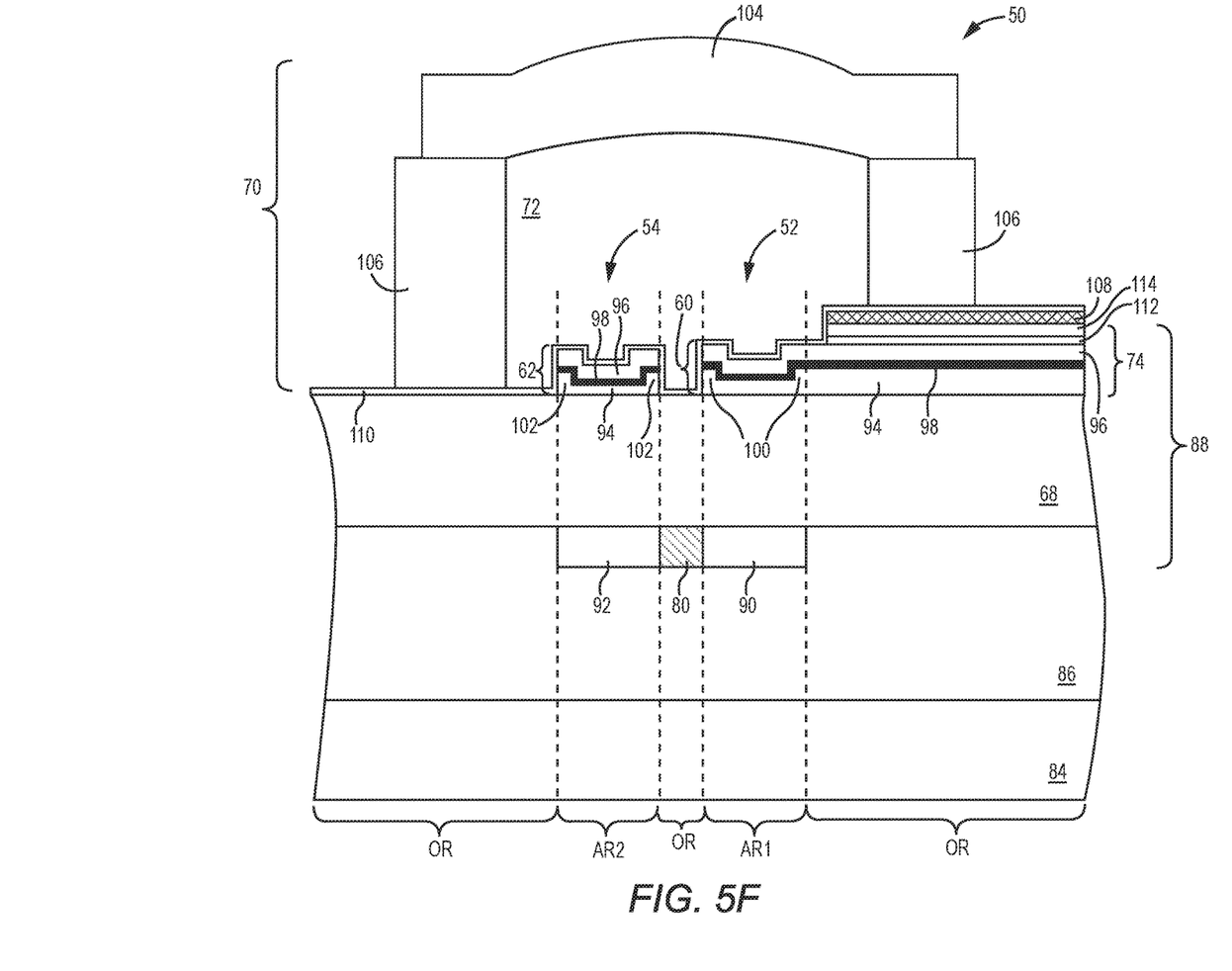

Lastly, the enclosure 70 is formed to complete the BAW filter 50 as shown in FIG. 5F. The enclosure 70 may be formed by Wafer-level packaging technologies and may form a part of a Wafer-level package. Herein, the enclosure 70 includes the cap 104 and the outer wall 106 that extends from the cap 104 toward the top surface of the piezoelectric layer 68 to form the cavity 72. The outer wall 106 is directly coupled to the passivation layer 110. The first top electrode 60 and the second top electrode 62 reside in the cavity 72. The first portion of the outer wall 106 resides over the ARL 108 that is over at least the first portion of the top surface of the first top electrode lead 74. A second portion of the outer wall 106 resides over the top surface of the piezoelectric layer 68 and not over the first top electrode lead 74.

It should be noted that while much of the discussion herein focuses on examples of the BAW filter 50, other BAW-based devices may also utilize the concepts of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a piezoelectric layer;
   a bottom electrode on a bottom surface of the piezoelectric layer;
   a top electrode on a top surface of the piezoelectric layer, wherein:
      the top surface of the piezoelectric layer is opposite the bottom surface of the piezoelectric layer; and an active region for a resonator is formed where the bottom electrode and the top electrode overlap;
a top electrode lead on the top surface of the piezoelectric layer and extending from the top electrode;
an enclosure comprising a cap and an outer wall that extends from the cap toward the top surface of the piezoelectric layer to form a cavity, wherein the top electrode resides in the cavity and a first portion of the outer wall resides over a first portion of a top surface of the top electrode lead; and
an anti-reflective layer (ARL) between the first portion of the outer wall and the first portion of the top surface of the top electrode lead, wherein the ARL has a reflectance less than 40% R.

2. The apparatus of claim 1 wherein the ARL has a reflectance less than 30% R.

3. The apparatus of claim 1 wherein the ARL has a reflectance less than 20% R.

4. The apparatus of claim 1 wherein the ARL has a reflectance less than 10% R.

5. The apparatus of claim 1 wherein the ARL is formed of Tungsten (W), Titanium Tungsten (TiW), Titanium Nitride (TiN), or Molybdenum (Mo).

6. The apparatus of claim 1 wherein the ARL does not cover the top electrode.

7. The apparatus of claim 1 wherein the ARL covers the top surface of the top electrode lead at all portions that are aligned below the outer wall.

8. The apparatus of claim 1 wherein the top surface of the top electrode lead is fully covered by the ARL.

9. The apparatus of claim 1 wherein the ARL extends over a portion of the top electrode.

10. The apparatus of claim 1 wherein the top electrode lead includes an electrode layer at the top of the top electrode lead, wherein the ARL is less reflective than the electrode layer of the top electrode lead.

11. The apparatus of claim 1 wherein the top electrode and the top electrode lead share at least a common portion of a first electrode layer and a common portion of a second electrode layer, wherein:
the first electrode layer is over the top surface of the piezoelectric layer;
the second electrode layer is over the first electrode layer; and
the ARL is over the second electrode layer, wherein the ARL is less reflective than the second electrode layer.

12. The apparatus of claim 11 wherein:
the first electrode layer is formed of Tungsten (W) or Molybdenum (Mo); and
the second electrode layer is formed of Aluminum Copper (AlCu).

13. The apparatus of claim 11 wherein the top electrode lead further comprises a third electrode layer and a fourth electrode layer, wherein:
the third electrode layer is over the second electrode layer;
the fourth electrode layer is over the third electrode layer;
the ARL is over the fourth electrode layer, wherein the ARL is less reflective than the fourth electrode layer; and
the top electrode does not include the third electrode layer or the fourth electrode layer.

14. The apparatus of claim 13 wherein:
the first electrode layer is formed of W or Mo;
the second electrode layer is formed of AlCu;
the third electrode layer is formed of W; and
the fourth electrode layer is formed of AlCu.

15. The apparatus of claim 11 wherein the top electrode further includes a border ring that is between the first electrode layer and the second electrode layer, and around a periphery of the active region.

16. The apparatus of claim 15 wherein the border ring is formed of Tungsten (W) or Molybdenum (Mo).

17. The apparatus of claim 1 further comprises a passivation layer directly over a portion of the top surface of the piezoelectric layer, exposed surfaces of the top electrode, exposed surfaces of the top electrode lead, and the ARL, wherein:
the portion of the top surface of the piezoelectric layer is exposed through the top electrode and the top electrode lead; and
the outer wall of the enclosure is directly coupled to the passivation layer.

18. The apparatus of claim 17 wherein the passivation layer is formed of Silicon Nitride (SiN), Silicon dioxide ($SiO_2$), or Silicon Oxynitride (SiON).

19. The apparatus of claim 17 wherein the passivation layer has a thickness between 250 Å and 5000 Å.

20. The apparatus of claim 17 wherein the passivation layer has a thickness between 500 Å and 1500 Å.

21. The apparatus of claim 1 wherein the ARL has a thickness between 50 Å and 5000 Å.

22. The apparatus of claim 1 wherein the ARL has a thickness between 100 Å and 500 Å.

23. The apparatus of claim 1 wherein the enclosure is formed of TMMF, SU-8, or photo-definable epoxies.

24. The apparatus of claim 1 further comprises a second top electrode that is on the top surface of the piezoelectric layer, separate from the top electrode and the top electrode lead, and exposed to the cavity.

25. A method comprising:
providing a bottom electrode;
forming a piezoelectric layer, wherein the bottom electrode is coupled to a bottom surface of the piezoelectric layer;
forming a top electrode on a top surface of the piezoelectric layer, wherein:
the top surface of the piezoelectric layer is opposite the bottom surface of the piezoelectric layer; and
an active region for a resonator is formed where the bottom electrode and the top electrode overlap;
forming a top electrode lead that is on the top surface of the piezoelectric layer and extending from the top electrode;
applying an anti-reflective layer (ARL) over a first portion of a top surface of the top electrode lead, wherein the ARL has a reflectance less than 40% R; and
forming an enclosure that comprises a cap and an outer wall, wherein:
the outer wall extends from the cap toward the top surface of the piezoelectric layer to form a cavity;
a first portion of the outer wall resides over the ARL that is over the first portion of the top surface of the top electrode lead; and
the top electrode resides in the cavity.

26. The method of claim 25, wherein the enclosure forms a part of a Wafer-level package.

* * * * *